(12) United States Patent
Seo

(10) Patent No.: US 7,573,756 B2
(45) Date of Patent: Aug. 11, 2009

(54) SENSE AMPLIFIERS AND SEMICONDUCTOR MEMORY DEVICES FOR REDUCING POWER CONSUMPTION AND METHODS FOR OPERATING THE SAME

(75) Inventor: Seong Young Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 11/882,738

(22) Filed: Aug. 3, 2007

(65) Prior Publication Data

US 2008/0175073 A1    Jul. 24, 2008

(30) Foreign Application Priority Data

Jan. 22, 2007    (KR) .................... 10-2007-0006737

(51) Int. Cl.
*G11C 7/00*    (2006.01)
(52) U.S. Cl. ..................... 365/189.15; 365/189.05; 365/203; 365/205; 365/207
(58) Field of Classification Search ............ 365/189.05, 365/189.15, 203, 205, 207
See application file for complete search history.

(56) References Cited

U.S. PATENT DOCUMENTS 6,424,577 B2 *    7/2002    Sim ..................... 365/189.05
6,483,351 B2      11/2002   Sim
6,483,353 B2 *    11/2002   Kim et al. .................... 327/55

FOREIGN PATENT DOCUMENTS

| JP | 2002-288982 | 10/2002 |
|---|---|---|
| KR | 1020010093475 | 10/2001 |
| KR | 10200020069552 | 9/2002 |
| KR | 10-0382734 | 4/2003 |
| KR | 1020050097065 | 10/2005 |

* cited by examiner

*Primary Examiner*—Hoai V Ho
(74) *Attorney, Agent, or Firm*—Harness, Dickey & Pierce, P.L.C.

(57) ABSTRACT

In a sense amplifier, a current amplifier outputs a first and a second voltage signal in response to a first control signal. The first and second voltage signals are output based on a detected current difference between a pair of input/output lines. A voltage amplifier generates a third and a fourth voltage signal based on a detected voltage difference between the first and second voltage signals. The third and a fourth voltage signals are generated in response to a second control signal. A first latch circuit latches the third and fourth voltage signals, and outputs a first output signal in response to the second control signal. A second latch circuit latches the first and second voltage signals and outputs a second output signal in response to a third control signal. An output circuit performs a logic operation on the first output signal and the second output signal, and outputs a result of the logic operation as a resultant signal.

20 Claims, 5 Drawing Sheets

SENSE AMPLIFIERS AND SEMICONDUCTOR MEMORY DEVICES FOR REDUCING POWER CONSUMPTION AND METHODS FOR OPERATING THE SAME

PRIORITY STATEMENT

This U.S. patent application claims priority under 35 U.S.C. §119 to Korean Patent Application No. 10-2007-0006737, filed on Jan. 22, 2007, in the (Korean Intellectual Property Office (KIPO), the entire contents of which is incorporated herein by reference.

BACKGROUND

Description of the Related Art

Sizes of conventional semiconductor memory devices may increase as technology develops. As such, lengths of data lines for inputting and outputting data of the semiconductor memory device may also increase, causing an increase in resistance and/or power consumption.

In a conventional read operation, loss generated in a signal output from a memory cell array may correspond to length of a data I/O line. To counteract such losses, conventional semiconductor memory devices may include an I/O sense amplifier for amplifying a data signal output from the memory cell array and outputting an amplified data signal to the outside of the semiconductor memory device.

Conventionally, a pair of bit lines may be connected to the memory cell and the data signal stored in the memory cell may be amplified and output by the bit line sense amplifier. However, because the level of an output signal of the bit line sense amplifier is relatively small, the output signal is amplified again before being output by the I/O sense amplifier at an end of the I/O data line. As a result, conventional semiconductor memory devices may consume a relatively large amount of power in the I/O sense amplifier.

SUMMARY

Example embodiments relate to semiconductor devices, for example, input/output sense amplifiers, which m.-ay reduce power consumption. According to at least one example embodiment, I/O sense amplifiers may reduce unnecessary power consumption by selectively changing an operating mode of the I/O sense amplifier according to the length of the I/O sense amplifier of a memory cell during the data read of a semiconductor memory device, and methods of operating I/O sense amplifiers.

In at least one example embodiment of an input/output sense amplifier, a current amplifier may detect a current difference between a pair of input/output lines, amplify the detected current difference, and output voltage signals in response to a first control signal. A voltage amplifier may detect and amplify a voltage difference between output signals of the current amplifier in response to a second control signal. A first latch circuit may latch output signals from the voltage amplifier and output a first output signal in response to the second control signal. A second latch circuit may latch output signals of the current amplifier and output a second output signal in response to a third control signal. An output circuit may receive and perform a logical operation of the first output signal and the second output signal and output a result of the operation. The voltage amplifier may be a current mirror type voltage amplifier.

According to at least some example embodiments, each of the first latch circuit and the second latch circuit may be a cross-coupling-type latch circuit. The second control signal and the third control signal may be selectively enabled based on a row address signal. The second control signal may be generated based on a first row address signal. The first row address signal may address word lines in a group located a first distance (e.g., relatively far) from the input/output sense amplifier when the word lines are grouped into at least two groups. The third control signal may be generated based on a second row address signal. The second row address signal may address word lines in a group located a second distance (e.g., relatively close) to the input/output sense amplifier when the word lines are grouped into at least two groups. The first distance may be greater than the second distance.

According to at least some example embodiments, the output circuit may logically multiply the first output signal and the second output signal and output a multiplied signal. The first latch circuit and the second latch circuit may be pre-charged to a first voltage level. The first output signal and the second output signal may swing to a given or desired (e.g., CMOS) voltage level.

In at least one example embodiment of a semiconductor memory device, a memory cell array may be configured to store data. An input/output sense amplifier may amplify a data signal received through a pair of input/output lines. Within the input/output sense amplifier, a current amplifier may be configured to detect a current difference between the input/output lines, amplify a detected current difference, and output voltage signals in response to a first control signal. A voltage amplifier may detect and amplify a voltage difference between output signals of the current amplifier in response to a second control signal. A first latch circuit may latch output signals of the voltage amplifier and output a first output signal in response to the second control signal. A second latch circuit may latch output signals of the current amplifier and output a second output signal in response to a third control signal. An output circuit may receive and perform a logical operation of the first output signal and the second output signal and output a result of the operation.

In at least one example embodiment of a method of operating an input/output sense amplifier, a current difference between a pair of input/output lines may be detected, and the detected current difference may be amplified. Voltage signals may be output in response to a first control signal using a current amplifier. A voltage difference between output signals of the current amplifier may be detected and amplified in response to a second control signal using a voltage amplifier. A first output signal may be output based on output signals of the voltage amplifier in response to the second control signal using a first latch circuit. A second output signal may be output based on output signals of the current amplifier in response to a third control signal using a second latch circuit. A logic operation may be performed on the first output signal and the second output signal and the result may be output using an output circuit.

According to at least some example embodiments, the first output signal may maintain a power voltage level when the second control signal is disabled and the second output signal may maintain the power voltage level when the third control signal is disabled. The second control signal may be generated based on a first row address signal. The first row address signal may address word lines in a group located a first distance (e.g., relatively far) from the input/output sense amplifier when the word lines are grouped into at least two groups. The third control signal may be generated based on a second row address signal. The second row address signal may address word lines in a group located a second distance (e.g., relatively close) to the input/output sense amplifier when the word lines are grouped into at least two groups.

BRIEF DESCRIPTION OF THE DRAWINGS

Example embodiments will become more apparent by describing in detail example embodiments shown in the attached drawings in which.

DETAILED DESCRIPTION OF EXAMPLE EMBODIMENTS

Figure 1:
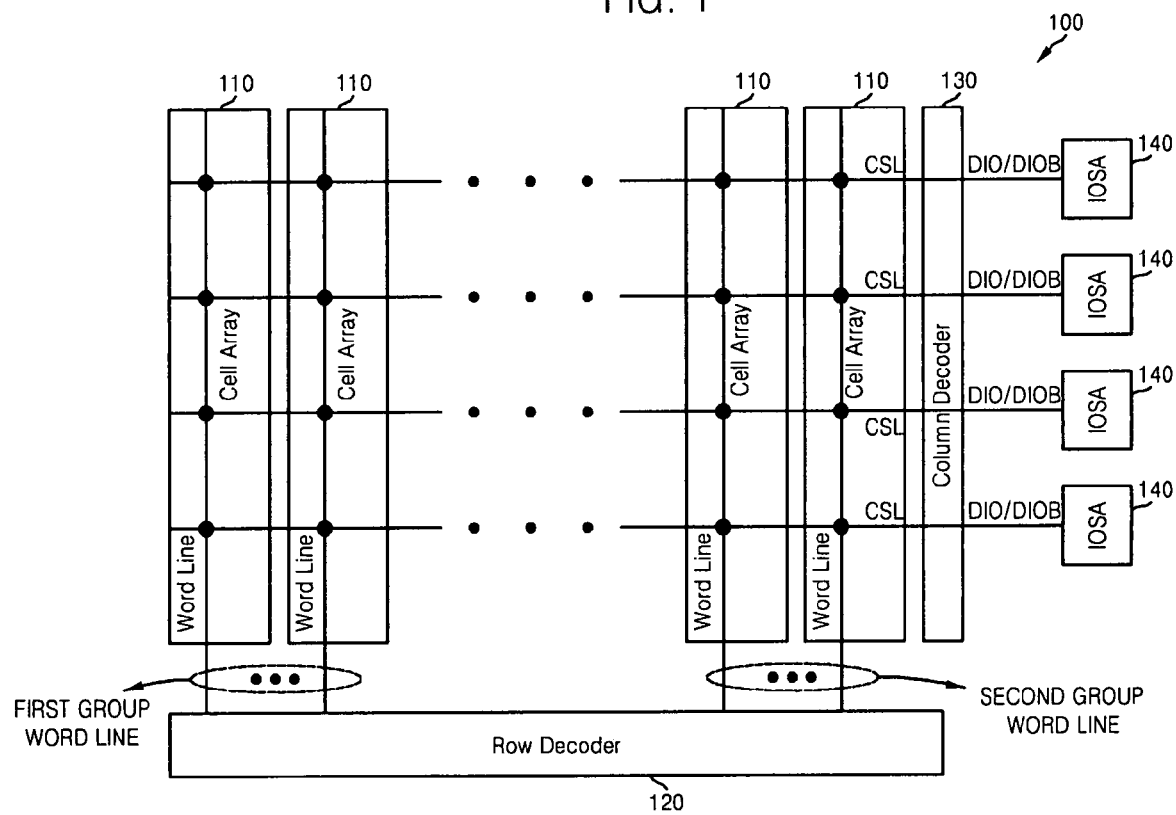
FIG. 1 schematically illustrates a semiconductor memory device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
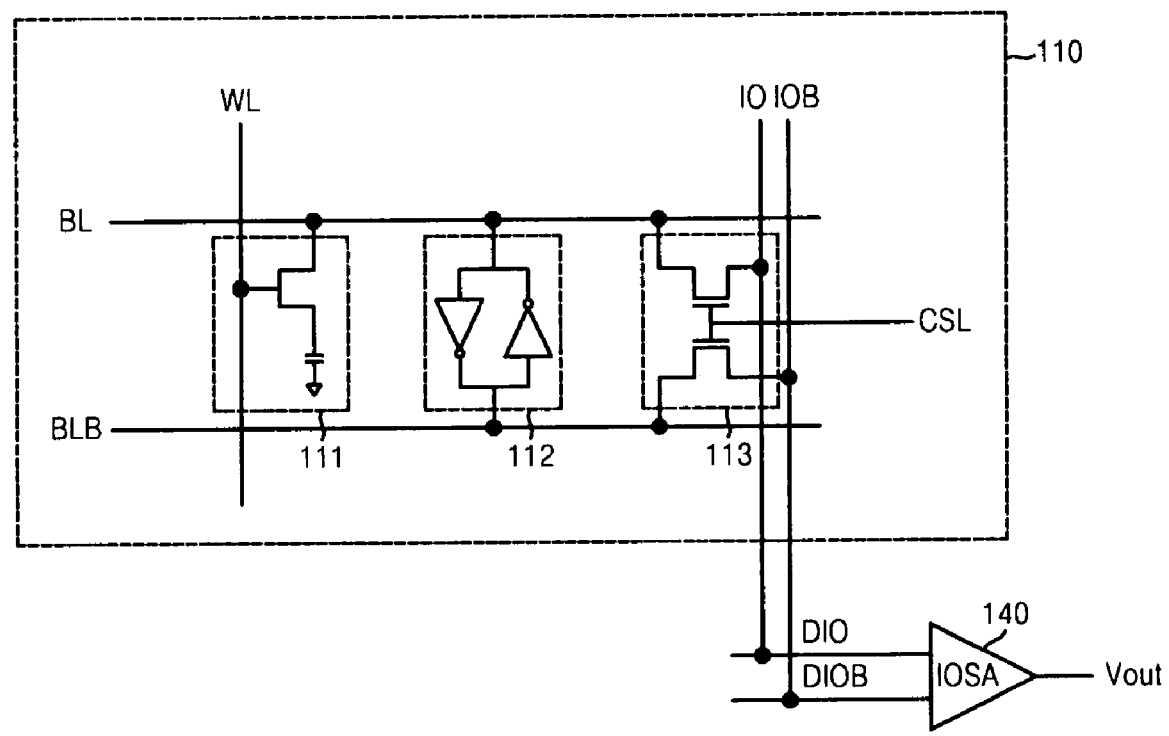
FIG. 2 schematically illustrates an example configuration of a memory cell array according to an example embodiment.

FIG. 1 schematically illustrates an example configuration of a semiconductor memory device according to an example embodiment. FIG. 2 schematically illustrates an example configuration of the memory cell array of FIG. 1. Referring to FIGS. 1 and 2, a semiconductor memory device 100 may include a plurality of memory cell arrays 110, a row decoder circuit 120, a column decoder circuit 130 and a plurality of input/output (I/O) sense amplifiers 140.

The memory cell array 110 may include a memory cell 111, a bit line sense amplifier 112 and a column selection circuit 113. During a read operation of the semiconductor memory device 100, the memory cell 111 may output data stored at the memory cell 111 in response to selection of a word line based on a row address signal.

The bit line sense amplifier 112 may amplify a data signal received from the memory cell 111 through a pair of bit lines (BL/BLB) to first voltage level. In response to a column selection signal (CSL), the column select circuit 113 may output the data signal amplified by the bit line sense amplifier 112.

The row decoder circuit 120 may decode a row address signal and output a word line selection signal to enable one or more of the word lines of the semiconductor memory device 100. The column decoder circuit 130 may decode a column address signal and output the CSL to select one or more of the bit lines of the memory cell arrays 110.

The I/O sense amplifier 140 may receive a data signal output from the memory cell arrays 110 through a pair of local I/O lines (IO/IOB) and a pair of global I/O lines (DIO/DIOB). The I/O sense amplifier 140 may convert the received data signal to a first (e.g., CMOS) voltage level and output the resultant signal.

Figure 3:
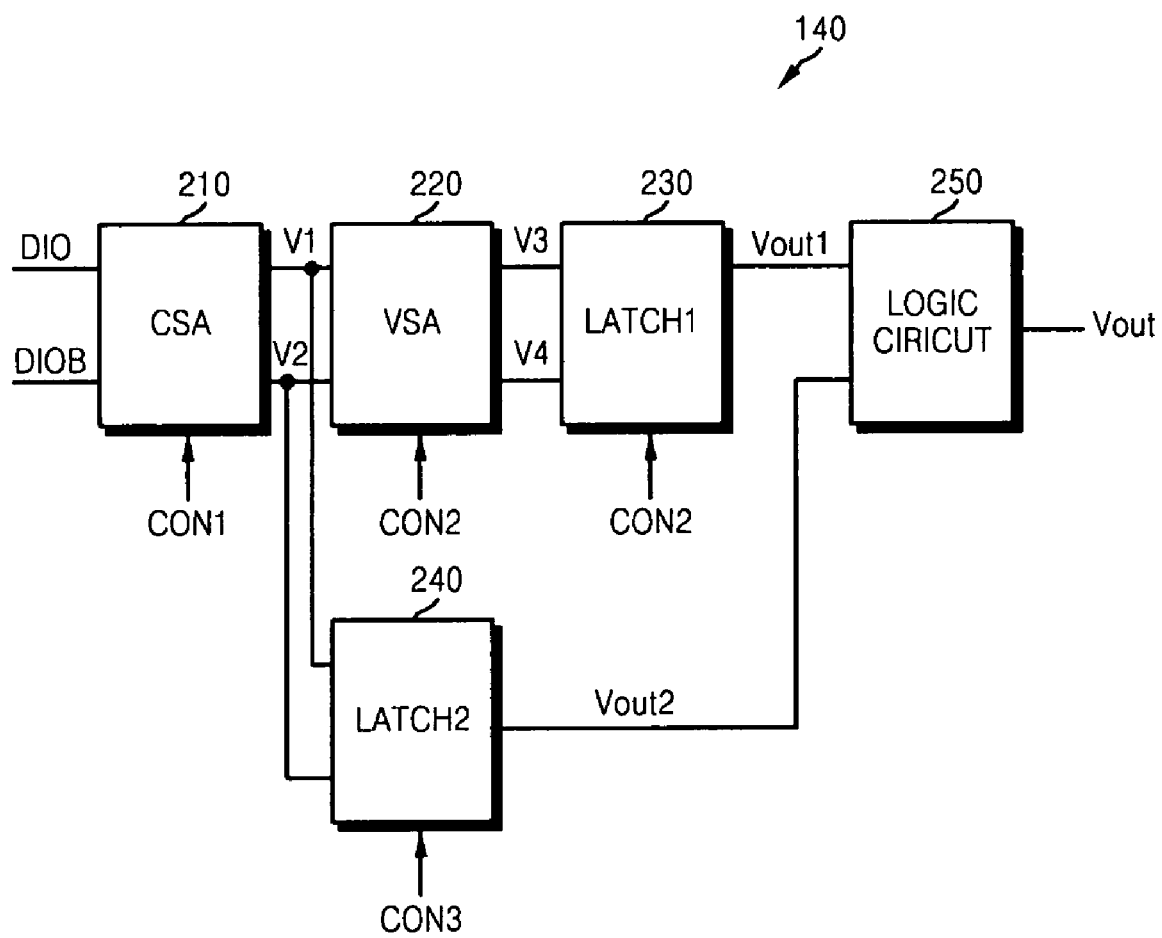
FIG. 3 schematically illustrates an example configuration of a I/O sense amplifier according to an example embodiment.
Figure 4:
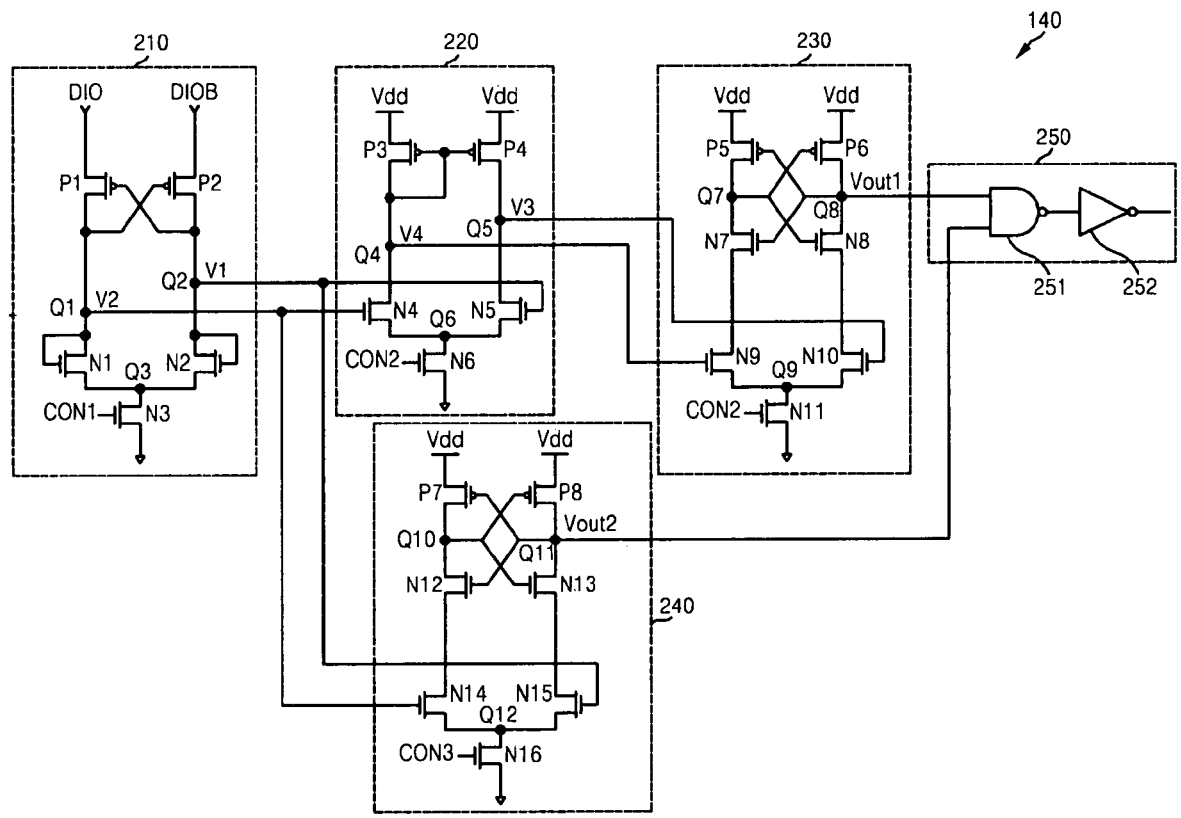
FIG. 4 is a detailed circuit diagram of the I/O sense amplifier of FIG. 3.

FIG. 3 schematically illustrates an example configuration of the I/O sense amplifier 140. FIG. 4 is a more detailed circuit diagram of the I/O sense amplifier 140. Referring to FIGS. 1 through 4, the I/O sense amplifier 140 may include a current amplifier 210, a voltage amplifier 220, a first latch circuit 230, a second latch circuit 240 and an output circuit 250.

The current amplifier 210 may include a first current amplifier switching circuit including first and second transistors (e.g., PMOS transistors) P1 and P2 and a second current amplifier switching circuit including first through third transistors (e.g., NMOS transistors) N1, N2 and N3. The first transistor P1 may be connected between I/O line DIO and output node Q1, and the second transistors P2 may be connected between I/O line DIOB and output node Q2. The gate terminal of the first transistor P1 may be connected to the output node Q2, and the gate terminal of the second transistor P2 may be connected to the output node Q1.

The first transistor N1 may be connected between the first node Q1 and a third node Q3. The gate terminal and the source terminal of the first NMOS transistor N1 may be connected to each other. The second transistor N2 may be connected between the second node Q2 and the third node Q3. The gate terminal and the source terminal of the second transistor N2 may be connected to each other. The third transistor N3 may be connected between the third node Q3 and a ground terminal Vss and may be enabled in response to a first control signal CON1.

In example operation, the current amplifier 210 may detect a current level of the global I/O lines DIO and DIOB output from a selected one of the memory cell arrays 110 in the semiconductor memory device 100. The current amplifier 210 may convert the current of the global I/O lines DIO and DIOB to a desired voltage level in response to the first control signal CON1. The current amplifier 210 may amplify and output the converted voltage. The first control signal CON1 may be generated based on a read command from the semiconductor memory device 100.

The voltage amplifier 220 may include a first voltage amplifier switching circuit including third through fourth transistors (e.g., PMOS transistors) P3 and P4 and a second voltage amplifier switching circuit including fourth through sixth transistors (e.g., NMOS transistors) N4, N5 and N6.

The third transistor P3 may be connected between a power port or supply voltage Vdd and a fourth node Q4. The fourth transistor P4 may be connected between the supply voltage Vdd and a fifth node Q5. The gate terminals of the third and fourth transistors P4 and P5 may be connected to the fourth node Q4.

The fourth transistor N4 may be connected between the fourth node Q4 and a sixth node Q6. The fourth transistor N4 may operate in response to an output voltage V2 of the first node Q1. The fifth transistor N5 may be connected between the fifth node Q5 and the sixth node Q6 and may operate in response to an output voltage V1 of the second node Q2. The sixth transistor N6 may be connected between the sixth node Q6 and a ground terminal Vss and may operate in response to a second control signal CON2.

In example operation, the voltage amplifier 220 may detect output voltages V1 and V2 of the current amplifier 210, amplify and output a difference between the detected output voltages V1 and V2 of the current amplifier 210 in response to the second control signal CON2. The voltage amplifier 220 may be a differential amplifier, for example, a current mirror-type amplifier. The second control signal CON2 may be generated based on a first row address signal and a read command. The first row address signal may address word lines in a group located relatively far from the I/O sense amplifier 140 when the word lines are grouped into at least two groups. For example, the first row address signal may select one or more of the word lines of the first group of the word lines shown in FIG. 1.

The first latch circuit 230 may include fifth through sixth transistors (e.g., PMOS transistors) P5 and P6 and seventh through tenth transistors (e.g., NMOS transistors) N7, N8, N9, N10 and N11. The fifth transistor P5 may be connected between the supply voltage Vdd and the seventh node Q7. The sixth transistor P6 may be connected between the supply voltage Vdd and the eighth node Q8.

The ninth transistor N9 may operate in response to an output voltage V4 of the fourth node Q4. The tenth transistor N10 may operate in response to an output voltage V3 of the fifth node Q5. The eleventh transistor N11 may be connected between the ninth node Q9 and the ground terminal Vss and enabled in response to the second control signal CON2.

In example operation, the first latch circuit 230 may detect output signals V3 and V4 of the voltage amplifier 220 and may convert the voltage level of the output signal Vout1 to a first (e.g., CMOS) voltage level in response to the second control signal CON2. The first latch circuit 230 may output the converted output signal Vout1. The first latch circuit 230 may include a pre-charge circuit (not shown) and may maintain an output signal Vout1 at a desired level, for example, a high logic level or "1" during a disable operation.

The second latch circuit 240 may include seventh through eighth transistors (e.g., PMOS transistors) P7 and P8 and twelfth through sixteenth transistors (e.g., NMOS transistors) N12, N13, N14, N15 and N16.

The seventh transistor P7 may be connected between the supply voltage Vdd and a tenth node Q10. The eighth transistor P8 may be connected between the supply voltage Vdd and an eleventh node Q11. The twelfth transistor N12 and the fourteenth transistor N14 may be connected in series between the tenth node Q10 and the twelfth node Q12. The thirteenth transistor N13 and the fifteenth transistor N15 may be connected in series between the eleventh node Q11 and the twelfth node Q12.

The gate terminals of the seventh transistor P7 and the twelfth transistor N12 may be connected to the eleventh node Q11. The gate terminals of the eighth transistor P8 and the thirteenth transistor N13 may be connected to the tenth node Q10.

The fourteenth transistor N14 may be operated in response to the output voltage V2 of the first node Q1. The fifteenth transistor N15 may be operated in response to the output voltage V1 of the second node Q2. The sixteenth transistor N16 may be connected between the twelfth node Q12 and the ground terminal Vss and enabled in response to a third control signal CON3.

In example operation, the second latch circuit 240 may detect output signals V1 and V2 of the current amplifier 210 and may convert the voltage levels of the output signals V1 and V2 of the current amplifier 210 to a first (e.g., CMOS) voltage level in response to the third control signal. The second latch circuit 240 may output the converted voltage level as output signal Vout2. The second latch circuit 240 may include a pre-charge circuit (not shown) and may maintain the output signal Vout2 at a desired level, for example, a logic high level or "1", during a disable operation. The first and second latch circuits 230 and 240 may be embodied as a cross-coupling-type latch circuit.

The third control signal CON3 may be generated based on a second row address signal and a read command. The second row address signal may address word lines in a group located relatively close to the I/O sense amplifier 140 when the word lines are grouped into at least two groups. For example, the second row address signal may select any one of the word lines of the second group of the word lines shown in FIG. 1.

The output circuit 250 may receive, logically multiply, and output the output signals Vout1 and Vout2 from the first and second latch circuits 230 and 240, respectively. The output circuit 250 may include a NAND gate 251 and an inverter 252. When the level of the output signals change based on operations of the first and second latch circuits 230 and 240, the output circuit 250 may operate based on the converted value.

Referring to FIGS. 1 through 4, in operation of the I/O sense amplifier according to at least some example embodiments, when the semiconductor memory device 100 performs a read operation, the I/O sense amplifier 140 may receive data output from the memory cell array 110 of the semiconductor memory device 100 through the global I/O lines DIO/DIOB.

The received data signal may be converted to voltage levels V1 and V2 in response to the first control signal CON1 by detecting the difference in the current of the data signal received through the current amplifier 210. The converted data signal may be output. A read signal of the semiconductor memory device 100 may be used as the first control signal CON1.

When the data signal is output, the I/O sense amplifier 140 may amplify and output an output voltage in response to control signals CON2 and CON3 generated based on the row address, or convert the output voltage to a first (e.g., CMOS) voltage level through the latch, and output the converted voltage.

When the row address is the first row address signal for reading data from a memory cell array located relatively far from the I/O sense amplifier 140, the I/O sense amplifier 140 may amplify the output voltage of the current amplifier 210 through the voltage amplifier 220. The output signal amplified by the voltage amplifier 220 may be input to the first latch circuit 230, amplified to the CMOS voltage level based on the second control signal CON2, and output as the first output signal Vout1.

Conversely, when the row address is the second row address signal for reading data from a memory cell array located relatively close to the I/O sense amplifier 140, the I/O sense amplifier 140 may disable the voltage amplifier 220 and the first latch circuit 230 and may enable the second latch circuit 240 to convert the output voltages V1 and V2 amplified by the current amplifier 210 to the CMOS voltage level and output the converted output voltage.

The I/O sense amplifier 140 may logically multiply and output the first and second output signals Vout1 and Vout2 through the output circuit 250. Thus, the semiconductor memory device may control operation of the I/O sense amplifier 140 based on the row address signal. For example, because the operation of the I/O sense amplifier 140 is controlled based on the length of the I/O data lines IO/IOB connected to the I/O sense amplifier 140, unnecessary power consumption may be reduced.

Figure 5:
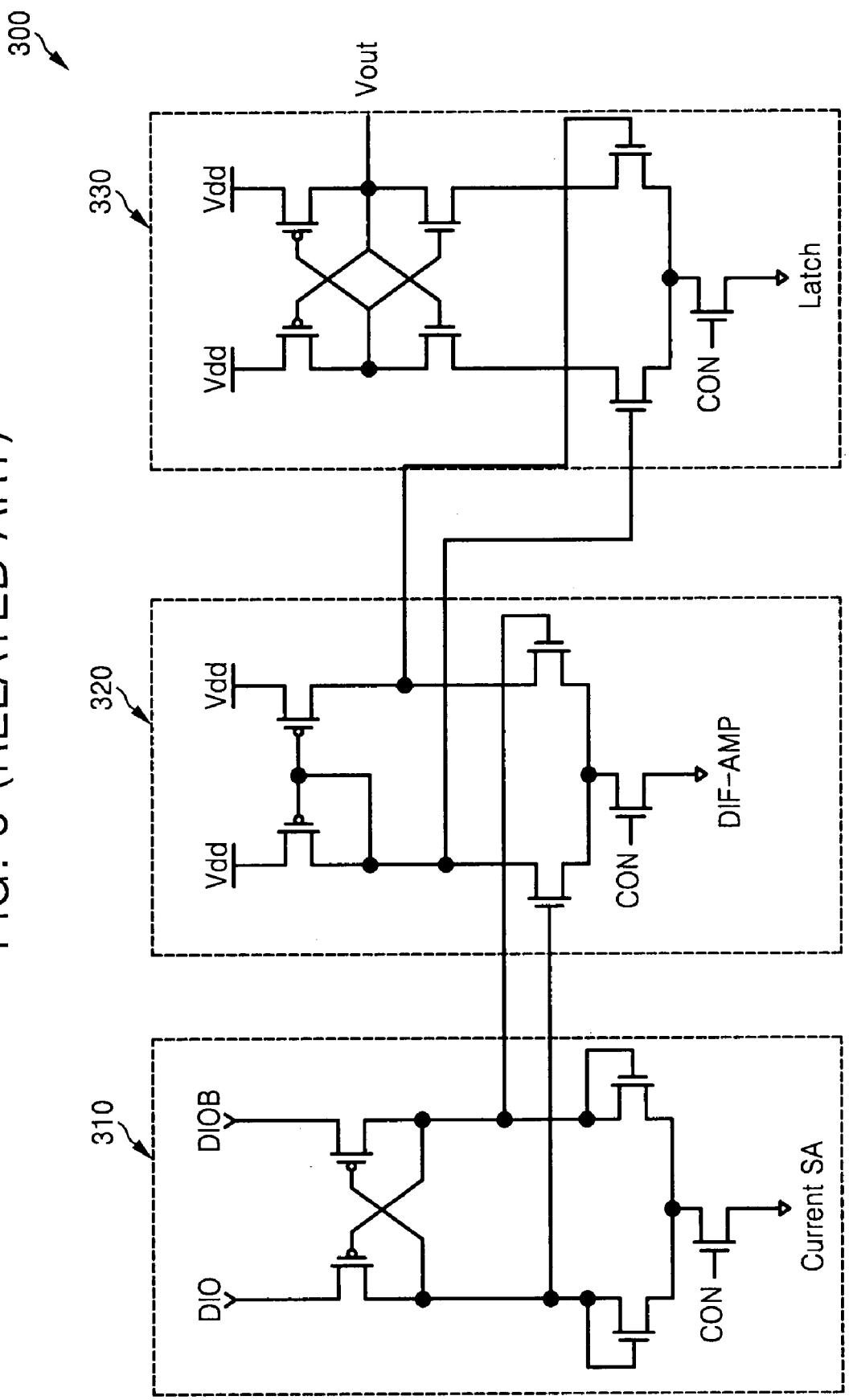
FIG. 5 is a circuit diagram of a related art I/O sense amplifier.

FIG. 5 is a circuit diagram of a conventional I/O sense amplifier showing an effect in comparison with example embodiments. Referring to FIG. 5, a conventional I/O sense amplifier 300 may include a current amplifier 310, a voltage amplifier 320 and a latch circuit 330. Because the structure and operation of the I/O sense amplifier 300 are the same as those of the I/O sense amplifier 140 of FIG. 4, the descriptions thereof will be omitted herein for the sake of brevity.

The I/O sense amplifier 300 may operate in response to a control signal CON. The control signal CON may be generated in response to a read command of the semiconductor memory device 100. In this example, all of the current amplifier 310, the voltage amplifier 320 and the latch circuit 330 may operate simultaneously or concurrently in response to the control signal CON. Thus, even when data located close to the I/O sense amplifier 300 is received, all the elements of the I/O sense amplifier 300 may operate so that power is consumed continuously.

By contrast, in the I/O sense amplifier 140 of FIG. 4 according to at least one example embodiment, the voltage amplifier 220 and the first latch circuit 230 may selectively operate according to the row address of the semiconductor memory device 100. Thus, power consumption may be less than that of the conventional I/O sense amplifier 300.

As described above, according to example embodiments, I/O sense amplifiers and operating methods of the I/O sense amplifier, may have reduced power consumption because the operating mode of the I/O sense amplifier may be selectively changed.

While example embodiments have been particularly shown and described with reference to example embodiments shown in the drawings, it will be understood by those skilled in the art that various changes in form and details may be made therein without departing from the spirit and scope of the present invention as defined by the appended claims.

What is claimed is:

1. A sense amplifier comprising:
    a current amplifier configured to output a first and a second voltage signal in response to a first control signal, the first and second voltage signals being output based on a detected current difference between a pair of input/output lines;
    a voltage amplifier configured to generate a third and a fourth voltage signal based on a detected voltage difference between the first and second voltage signals, the third and a fourth voltage signals being generated in response to a second control signal;
    a first latch circuit configured to latch the third and fourth voltage signals, and output a first output signal in response to the second control signal;
    a second latch circuit configured to latch the first and second voltage signals and output a second output signal in response to a third control signal; and
    an output circuit configured to perform a logic operation on the first output signal and the second output signal, and output a result of the logic operation as a resultant signal.

2. The sense amplifier of claim 1, wherein the current amplifier is further configured to,
    detect the current difference between the pair of input/output lines,
    amplify the detected current difference, and
    output the first and second voltage signals based on the amplified current difference.

3. The sense amplifier of claim 1, wherein the voltage amplifier is a current mirror-type voltage amplifier.

4. The sense amplifier of claim 1, wherein each of the first latch circuit and the second latch circuit are cross-coupling-type latch circuits.

5. The sense amplifier of claim 1, wherein the second control signal and the third control signal are selectively enabled based on a row address signal.

6. The sense amplifier of claim 5, wherein the second control signal is generated based on a first row address signal.

7. The sense amplifier of claim 6, wherein the first row address signal addresses word lines in a group located a first distance from the input/output sense amplifier when the word lines are grouped into at least two.

8. The sense amplifier of claim 5, wherein the third control signal is generated based on a second row address signal.

9. The sense amplifier of claim 8, wherein the second row address signal addresses word lines in a group that is located a second distance from the input/output sense amplifier when the word lines are grouped into at least two, the second distance being less than the first distance.

10. The sense amplifier of claim 1, wherein the output circuit logically multiplies the first output signal and the second output signal to generate a multiplied signal, and outputs the multiplied signal.

11. The sense amplifier of claim 1, wherein the first latch circuit and the second latch circuit are pre-charged to a first voltage level.

12. The sense amplifier of claim 1, wherein the first output signal and the second output signal are converted to a CMOS voltage level.

13. A semiconductor memory device comprising:
at least one memory cell array storing data; and
at least one the sense amplifier of claim 1, the at least one sense amplifier receiving a data signal from a corresponding one of the at least one memory cell array through the pair of input/output lines.

14. A method of operating a sense amplifier, the method comprising:
generating a first and a second voltage signal in response to a first control signal, the first and second voltage signals being generated based on a detected current difference between a pair of input/output lines;
outputting a third and a fourth voltage signal based on a detected voltage difference between the first and second voltage signals, the third and a fourth voltage signals being output in response to a second control signal;
latching the plurality of voltage signals;
generating a first output signal based on the third and fourth voltage signals and in response to a second control signal;
generating a second output signal based on the first and second voltage signals and in response to a third control signal;
performing a logic operation on the first output signal and the second output signal; and
outputting a result of the logic operation as a resultant signal.

15. The method of claim 14, wherein the generating of the first and second voltage signals includes,
detecting a current difference between a pair of input/output lines,
amplifying a detected current difference, and
outputting the first and second voltage signals in response to a first control signal.

16. The method of claim 14, wherein the first output signal maintains a first voltage level when the second control signal is disabled and the second output signal maintains the first voltage level when the third control signal is disabled.

17. The method of claim 14, wherein the second control signal is generated based on a first row address signal.

18. The method of claim 17, wherein the first row address signal addresses word lines in a group located a first distance from the sense amplifier when the word lines are grouped into at least two groups.

19. The method of claim 14, wherein the third control signal is generated based on a second row address signal.

20. The method of claim 19, wherein the second row address signal addresses word lines in a group located a second distance from the sense amplifier when the word lines are grouped into at least two groups, the second distance being less than the first distance.

* * * * *